United States Patent
Zucker et al.

(10) Patent No.: US 7,972,444 B2
(45) Date of Patent: Jul. 5, 2011

(54) WORKPIECE SUPPORT WITH FLUID ZONES FOR TEMPERATURE CONTROL

(75) Inventors: Martin L. Zucker, Orinda, CA (US);
Daniel J. Devine, Los Gatos, CA (US);
Vladimir Nagorny, Tracy, CA (US);
Jonathan Mohn, Saratoga, CA (US)

(73) Assignee: Mattson Technology, Inc., Fremont, CA (US)

( * ) Notice: Subject to any disclaimer, the term of this patent is extended or adjusted under 35 U.S.C. 154(b) by 76 days.

(21) Appl. No.: 11/936,576

(22) Filed: Nov. 7, 2007

(65) Prior Publication Data
US 2009/0114158 A1 May 7, 2009

(51) Int. Cl.
*C23C 16/00* (2006.01)
*C23F 1/00* (2006.01)
*H01L 21/306* (2006.01)

(52) U.S. Cl. ............ 118/728; 118/724; 156/345.51; 156/345.52; 156/345.53

(58) Field of Classification Search ........... 118/500, 118/725, 728
See application file for complete search history.

(56) References Cited

U.S. PATENT DOCUMENTS

| | | | |
|---|---|---|---|
| 4,565,601 A | 1/1986 | Kakehi et al. | |
| 5,350,479 A | 9/1994 | Collins et al. | |
| 5,609,720 A * | 3/1997 | Lenz et al. | 438/715 |
| 5,761,023 A | 6/1998 | Lue et al. | |
| 5,792,304 A * | 8/1998 | Tamura et al. | 156/345.27 |
| 6,159,299 A * | 12/2000 | Koai et al. | 118/715 |
| 6,320,736 B1 * | 11/2001 | Shamouilian et al. | 361/234 |
| 6,517,670 B2 * | 2/2003 | Okumura et al. | 156/345.28 |
| 6,740,853 B1 * | 5/2004 | Johnson et al. | 219/444.1 |
| 2004/0212947 A1 | 10/2004 | Nguyen et al. | |
| 2005/0173410 A1 * | 8/2005 | Okajima et al. | 219/538 |

FOREIGN PATENT DOCUMENTS

| | | |
|---|---|---|
| EP | 0 803 904 A | 10/1997 |
| JP | 1251735 | 10/1989 |

OTHER PUBLICATIONS

PCT International Search Report for PCT /US2008/081923, dated Jul. 7, 2009.

* cited by examiner

*Primary Examiner* — Maureen Gramaglia
*Assistant Examiner* — Tiffany Nuckols
(74) *Attorney, Agent, or Firm* — Dority & Manning, PA

(57) ABSTRACT

A workpiece support is disclosed defining a workpiece-receiving surface. The workpiece support includes a plurality of fluid zones. A fluid, such as a gas, is fed to the fluid zones for contact with a workpiece on the workpiece support. The fluid can have selected thermoconductivity characteristics for controlling the temperature of the workpiece at particular locations. In accordance with the present disclosure, at least certain of the fluid zones are at different azimuthal positions. In this manner, the temperature of the workpiece can be adjusted not only in a radial direction but also in an angular direction.

20 Claims, 8 Drawing Sheets

WORKPIECE SUPPORT WITH FLUID ZONES FOR TEMPERATURE CONTROL

BACKGROUND

Various types of process chambers are available for processing different types of workpieces. The workpieces may comprise, for instance, glass plates, films, ribbons, solar panels, mirrors, liquid crystal displays, semiconductor wafers, and the like. Many different types of process chambers are available, for instance, for processing semiconductor wafers during the manufacture of integrated circuit chips. The process chambers may be used to anneal the wafers, carry out chemical vapor deposition, physical vapor deposition, plasma and chemical etching processes, thermal processes, surface engineering and other processes. These types of process chambers typically contain a workpiece support for holding the workpiece within the chamber.

In many processes, it is desirable to control the temperature of the workpiece during processing. Processes can be optimized, for instance, if the temperature of the workpiece is uniform and is increased and decreased at desired rates and to desired maximums and minimums.

In the past, workpiece supports have been used to heat workpieces, cool workpieces, or to otherwise control the temperature of workpieces. In U.S. Pat. No. 5,609,720, in U.S. Pat. No. 5,761,023, and in Japanese Patent Application Number S63-78975 (1988) having Publication Number H1-251735 which are all incorporated herein by reference, workpiece supports are disclosed having an upper surface that define annular shaped channels filled with heat conducting gas at different pressures which contact the bottom surface of a workpiece for controlling the temperature of the workpiece.

For instance, U.S. Pat. No. 5,761,023 discloses a workpiece support having multiple pressure zones that are provided on the top surface of the support. A sealed area is provided between the two different zones to allow different gas pressures in the two zones. A higher gas pressure is provided to a zone corresponding to an area of the workpiece where greater heat transfer is desired. In this manner, the temperature of the workpiece can be controlled while the workpiece is being exposed to a process wherein the process can affect the temperature of the workpiece.

Although various attempts have been made to design workpiece supports that can control temperature non-uniformities and workpieces held on the workpiece support, various deficiencies and drawbacks still remain. Thus, a need exists for further improvements in workpiece supports capable of controlling the temperature of a workpiece within a process chamber.

SUMMARY

In general, the present disclosure is directed to a workpiece support for holding a workpiece in a process chamber, to a process for controlling the temperature of a workpiece in a process chamber and to a workpiece process system. In accordance with the present disclosure, the workpiece support includes a plurality of fluid zones that supply a fluid, such as a gas, in between the workpiece support and the workpiece for affecting the temperature of the workpiece within the zones. In accordance with the present disclosure, at least certain of the zones are not axisymmetric. In this manner, the temperature of the workpiece can be controlled at different locations along the azimuth of the workpiece where temperature irregularities may occur for example due to process induced non-uniform thermal flux.

For instance, in one embodiment, the present disclosure is directed to a workpiece support that includes a workpiece support defining a workpiece-receiving surface. The workpiece-receiving surface is for receiving and holding a workpiece, such as a semiconductor wafer. It should be understood, however, that any suitable workpiece may be held on the workpiece support according to the present disclosure.

The workpiece support includes a workpiece-receiving surface partitioned into a plurality of fluid zones. Each fluid zone is in communication with a corresponding fluid supply for containing a pressurized fluid between the workpiece-receiving surface of a single fluid zone and a corresponding surface section of the workpiece. When fluids are fed to each of the fluid zones, each fluid zone becomes pressurized. The fluid zones are separated such that each zone is configured to be pressurized independently of the other zones. Further, at least certain of the zones have a different azimuthal position on the workpiece-receiving surface. This construction may allow the temperature in each of the azimuthal zones to be adjusted independently so as to achieve a desired control temperature profile over the surface of the workpiece by correcting for non-uniform azimuthal process influences.

For example, in one embodiment, the workpiece-receiving surface may include an outer periphery that comprises a peripheral band. The peripheral band may be divided into the fluid zones having different azimuthal positions. For instance, the peripheral band may be divided into from about 2 zones to about 12 zones, such as from about 3 zones to about 12 zones. In one embodiment, the workpiece support may further include a fluid zone centrally located on the workpiece-receiving surface. The centrally located fluid zone may have a circular or polygonal shape and be surrounded by the peripheral band.

The fluid zones having the different azimuthal positions may all have a substantially identical shape and surface area. For instance, when located along a peripheral band, the peripheral band may be divided into equal portions. In other embodiments, however, the fluid zones having different azimuthal positions may have different sizes and shapes.

As described above, the fluid zones may be independently operated. For instance, in one embodiment, the fluid zones may be separated by ridges that form a seal with the workpiece positioned on the workpiece support.

In one embodiment, the workpiece support may comprise an electrostatic chuck that forms an electrostatic attraction with the workpiece. In this embodiment, for instance, the workpiece support may include at least one metallic electrode embedded in an appropriate dielectric material. Each electrode is encapsulated within the dielectric material and the workpiece support may be in communication with a DC power supply for applying a voltage to the encapsulated electrode.

The workpiece support made in accordance with the present disclosure can be used in conjunction with any suitable process chamber. In one embodiment, for instance, the workpiece support may be positioned in a process chamber that is in communication with a plasma supply for supplying plasma to the chamber. The plasma supply may be used, for instance, to conduct plasma enhanced chemical vapor deposition within the chamber on a workpiece. It should be understood, however, that the workpiece support may be used in process chambers in which various other processes are carried out such as annealing, ion etching, plasma etching, and the like.

In order to better control the temperature of the workpiece, the process chamber may include one or more temperature measuring devices measuring the temperature of the workpiece positioned on the workpiece support. The process chamber can further include a controller in communication with the temperature measuring device and the fluid supplies for each of the fluid zones. The controller, which can be any suitable programmable logic unit or microprocessor, can be configured to control pressure in each of the fluid zones based upon information received from the temperature measuring device.

In one embodiment, the controller, which can be any suitable programmable logic unit or microprocessor, can be configured to control the pressure in each of the fluid zones based upon information received from a model based control wherein the energy flux to each zone is predicted by a model based control algorithm.

In one embodiment, the chamber may include a plurality of temperature measuring devices. For example, a temperature-measuring device may be used to monitor the temperature of the workpiece at places on the workpiece corresponding to the location of each of the fluid zones. The temperature measuring devices may comprise, for instance, pyrometers.

The fluid that is fed to each of the fluid zones can vary depending upon the particular application. For example, a fluid may be selected that is non-reactive with the workpiece. For instance, in one embodiment, a non-reactive gas, such as helium, can be fed to each of the fluid zones. The amount of pressure that the gas exerts on the workpiece can also vary depending upon the desired result. In general, increasing the pressure of the gas against the workpiece increases the ability of the gas to regulate the workpiece temperature in the particular area where contact is made. In general, the gas pressure can be from about 1 to about 800 Torr (133 k Pa).

In addition to being directed to a workpiece support and to a process chamber, the present disclosure is also directed to a process for controlling the temperature of a workpiece. The process includes the steps, for instance, of placing a workpiece on a workpiece support in the process chamber. Once placed on the workpiece support, the workpiece is subjected to an energy source in the process chamber causing the temperature of the workpiece to increase. The energy source may comprise, for instance, a plasma source, a thermal energy source, and the like. In order to control the temperature of the workpiece during heating, fluid is fed into independent pressurized fluid zones in between the workpiece and a workpiece-receiving surface of the workpiece support. Each of the fluid zones affects the temperature of a corresponding portion of the workpiece. In accordance with the present disclosure, at least certain of the zones have different azimuthal positions on the workpiece.

Other features and aspects of the present invention are discussed in greater detail below.

BRIEF DESCRIPTION OF THE DRAWINGS

A full and enabling disclosure of the present invention, including the best mode thereof to one of ordinary skill in the art, is set forth more particularly in the remainder of the specification, including reference to the accompanying figures in which.

Figure 1:
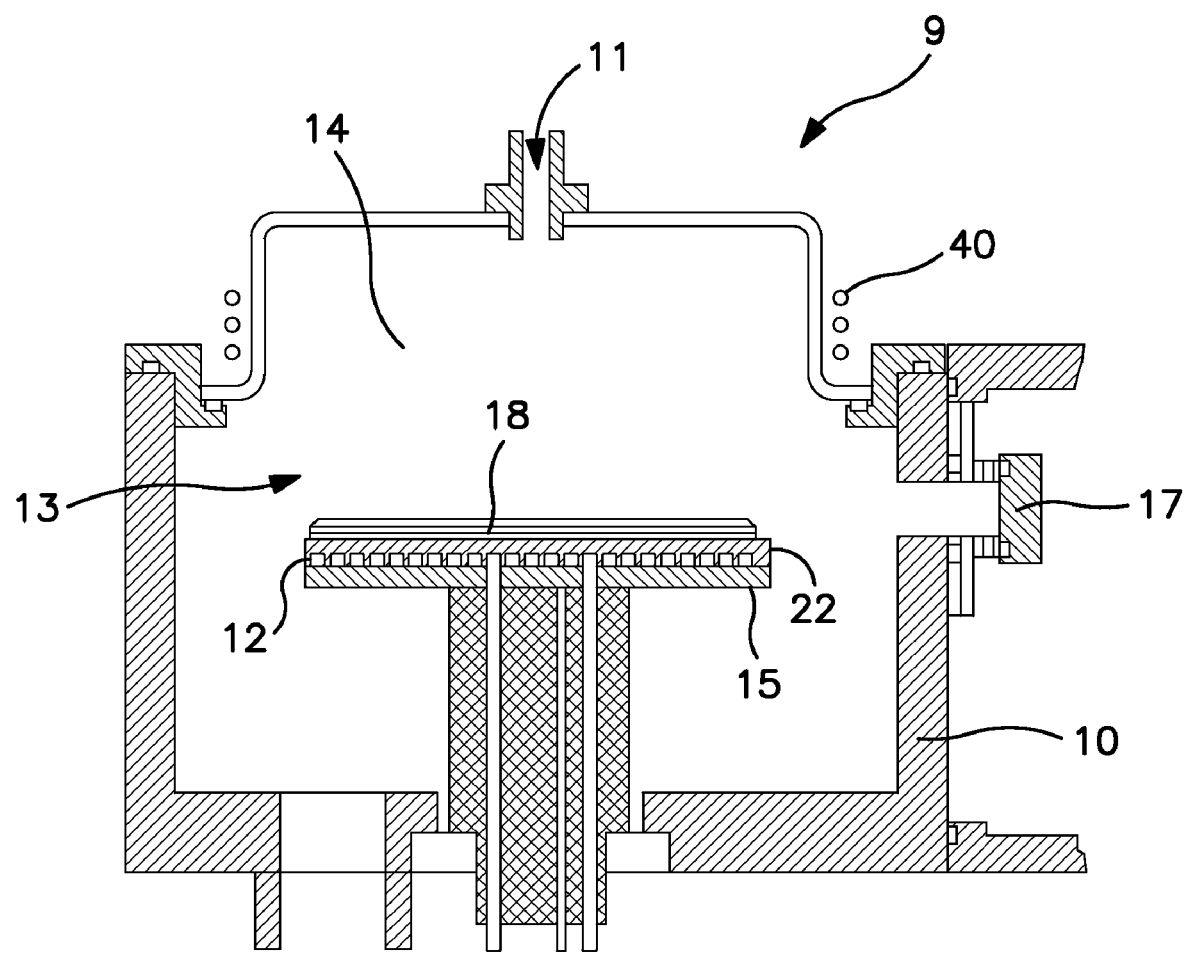
FIG. 1 is a cross-sectional view of one embodiment of a workpiece processing system made in accordance with the present disclosure.

Repeat use of reference characters in the present specification and drawings is intended to represent same or analogous features or elements of the present disclosure.

DETAILED DESCRIPTION

It is to be understood by one of ordinary skill in the art that the present discussion is a description of exemplary embodiments only, and is not intended as limiting the broader aspects of the present disclosure.

The present disclosure is generally directed to a workpiece support that is capable of not only holding the workpiece but is also capable of affecting the temperature of the workpiece while the workpiece is being processed in a process chamber. The temperature of the workpiece is controlled by a plurality of fluid zones that are created between the workpiece and the top surface of the workpiece support. A fluid, such as a gas having desired thermal conductivity properties, is fed into the fluid zones that cause heat transfer to occur between the portion of the workpiece surface opposite the fluid zone and the gas. By controlling the pressure in each of the fluid zones, the amount of heat transfer can be varied. In this manner, adjustments can be made to the temperature of the workpiece at particular locations.

In accordance with the present disclosure, at least some of the fluid zones are located at different azimuthal positions with respect to the workpiece. In the past, workpiece supports have been proposed that include multiple pressure zones for controlling heat transfer. The zones, however, had an annular shape which allowed for some control of the temperature in an axisymmetric manner only. The present inventors, however, have discovered that workpieces are rarely heated or cooled axisymmetrically. Instead, the temperature of a workpiece while being processed typically varies both radially and azimuthally. The temperature non-uniformities can occur due to numerous factors. The temperature of a workpiece at different azimuthal locations can change, for instance, due to the manner in which the workpiece is heated and the manner in which the workpiece cools. Further, the manner in which the workpiece is contacted by the workpiece support can also cause the temperature of the workpiece to vary over the surface of the workpiece in a non-axisymmetric manner.

The workpiece support of the present disclosure, therefore, is designed to provide temperature control on a workpiece in both a radial direction and in an angular direction.

Referring to FIG. 1, for instance, one embodiment of a workpiece processing system made in accordance with the present disclosure is shown. In the embodiment illustrated in FIG. 1, the system includes a process chamber 9. The process chamber 9 includes a workpiece processing station 13. The processing station 13 includes a workpiece support 12 made in accordance with the present disclosure. The process chamber shown in FIG. 1 includes one processing station 13 for processing one workpiece, such as a semiconductor wafer. It should be understood, however, that the process chamber 9 may include more than one processing station in other embodiments.

As shown, the processing station 13 includes a processing region 14. In the embodiment illustrated in FIG. 1, the processing region 14 is in communication with an isolation valve 17. Isolation valve 17 opens and closes so as to allow the workpiece to be exchanged. The isolation valve 17 seals to the process chamber wall 10.

In the embodiment illustrated, the workpiece support 12 includes the function of an electrostatic chuck. Electrostatic chucks are configured to produce an electrostatic force that holds a workpiece onto the top surface of the workpiece support. More particularly, the electrostatic chucks function by applying one, monopolar, or two, bipolar, high DC voltages between an electrostatic chuck and the workpiece. As will be described in greater detail below, the workpiece support 12 can include a top layer of a dielectric material that enables the electrostatic chuck function.

In one embodiment, a single, monopolar, DC voltage causes a positive charge on the top surface of the dielectric, which attracts negative charges in the workpiece. This charge relationship generates an attractive, substantially uniform, Coulomb force between the top surface of the workpiece support and a workpiece. It should be understood, however, that the teachings and principles of the present disclosure are also applicable to other workpiece supports that do not necessarily comprise electrostatic chucks.

In another embodiment, two, bipolar DC voltages cause both positive and negative charges on one side of the dielectric layer. These charges, generate attractive Coulomb forces between the top surface of the workpiece support and a workpiece.

The processing station 13 is configured to receive a workpiece on the workpiece support 12. Once the workpiece, such as a semiconductor wafer, is loaded into the process chamber, the workpiece is subjected to an energy source in order for the workpiece to undergo a desirable physical and/or chemical change. Energy sources that may be used to process workpieces can include, for instance, an ion source, a reactive chemical source, a thermal source, a plasma source, or mixtures thereof. Thermal sources that may be used to subject the workpieces to energy include light energy sources, such as, plasma arc lamps, tungsten halogen lamps, microwave, inductive, resistive heaters, or mixtures thereof.

In the embodiment illustrated in FIG. 1, process chamber 10 includes a plasma source for subjecting a workpiece to a plasma. The plasma is supplied by means of one or more induction coils 40 that are in communication with a RF impedance matching device (not shown) and in communication with a RF power supply (not shown).

Figure 2:
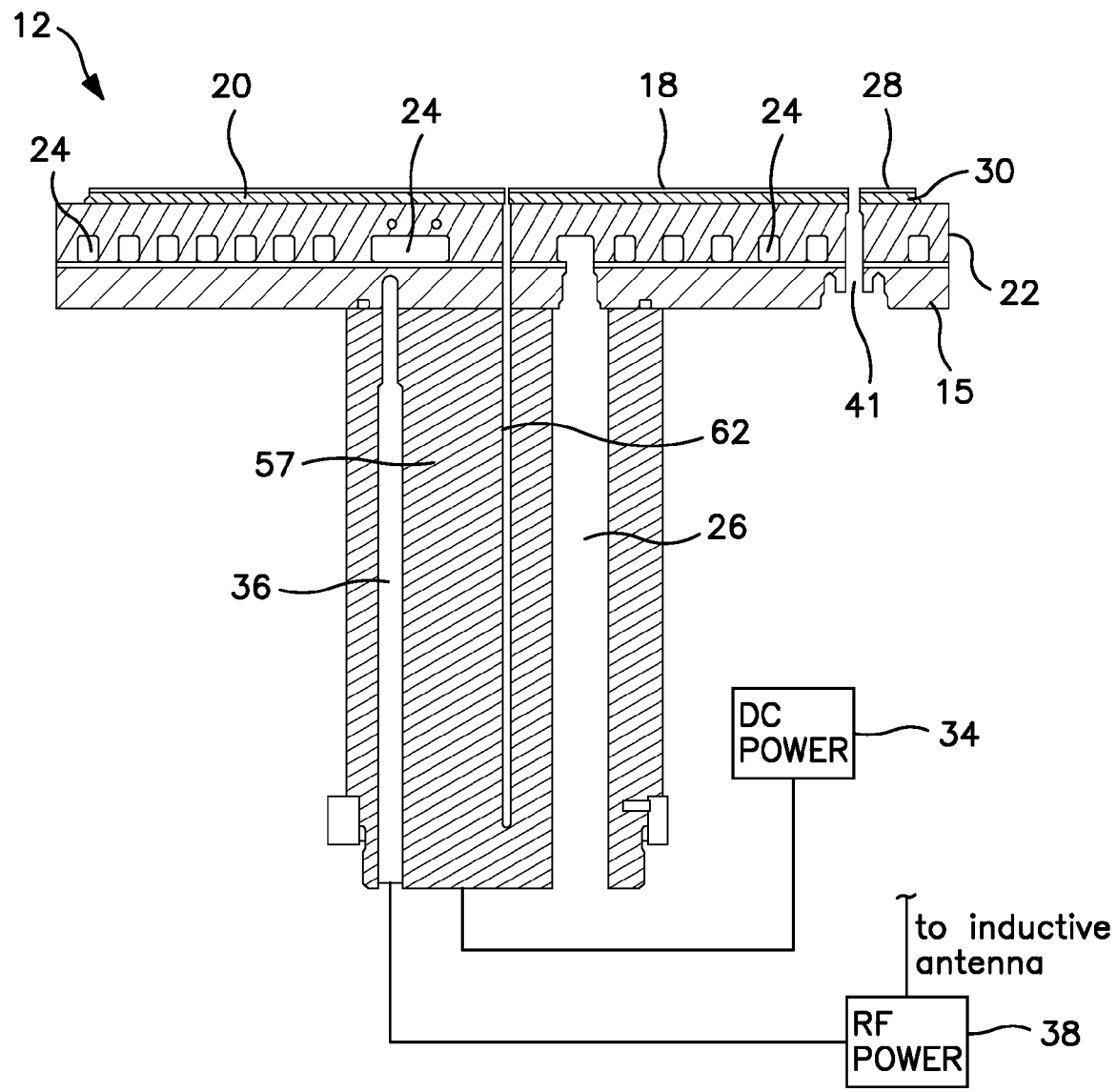
FIG. 2 is a cross-sectional view of one embodiment of a workpiece support made in accordance with the present disclosure.

Referring to FIG. 2, another cross-sectional view of the workpiece support 12 is illustrated. As shown, the workpiece support 12 includes a workpiece-receiving surface 18 that is defined by a dielectric portion 20. The dielectric portion 20 is positioned on top of a base that, in this embodiment, includes a first base portion 22 positioned over a second base portion 15. The base portions 22 and 15 are made from any suitable metallic or ceramic material. For instance, in one embodiment, the base portions 22 and 15 can be made from aluminum. The workpiece support 12 is attached to a workpiece support pedestal 57. The purpose of the pedestal is to provide rigid mechanical support for the workpiece support 12 and to provide both thermal and electrical isolation from the process chamber 9.

Figure 7:
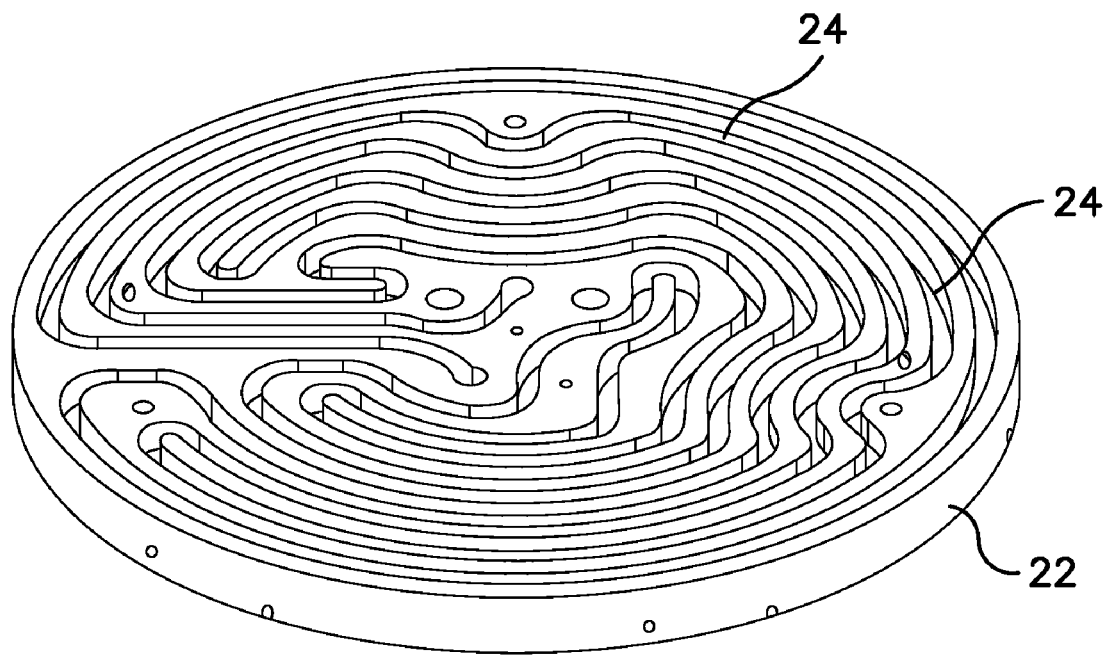
FIG. 7 is a perspective view of fluid cooling channels that may be incorporation into a workpiece support made in accordance with the present disclosure.

In one embodiment, the base portions 22 and 15 can be liquid cooled. In this regard, the workpiece support 12 can define a plurality of thermal control fluid channels 24. Referring to FIG. 7, for instance, one embodiment of a base is shown illustrating the thermal control fluid channels 24. As shown in FIG. 2, the thermal control fluid channels 24 are in communication with a primary thermal control inlet conduit 26. A thermal control fluid, such as water, is fed into the primary thermal control inlet conduit 26 for circulation in the thermal control fluid channels 24. Not shown, the workpiece support can further include a thermal control effluent conduit. The thermal control fluid, for instance, can flow into the thermal control effluent conduit after flowing through the thermal control fluid channels 24. From the thermal control effluent conduit, the thermal control fluid, in one embodiment, can be fed through a heat exchanger and recirculated back through the thermal control fluid channels.

As described above, the dielectric portion 20 is positioned on top of the base portion 22 and defines the workpiece-receiving surface 18. The dielectric portion 20 can be made from any suitable dielectric material, such as a ceramic material. The dielectric portion can comprise multiple layers of a dielectric material or can comprise a single layer.

In the embodiment illustrated in FIG. 2, for instance, the dielectric portion 20 includes a first dielectric layer 28 positioned on top of a second and thicker dielectric layer 30. The first dielectric layer 28, for instance, can have a thickness of about 0.4 to about 1 mm, while the second dielectric layer 30 can have a thickness of from about 2 mm to about 5 mm.

Figure 6:
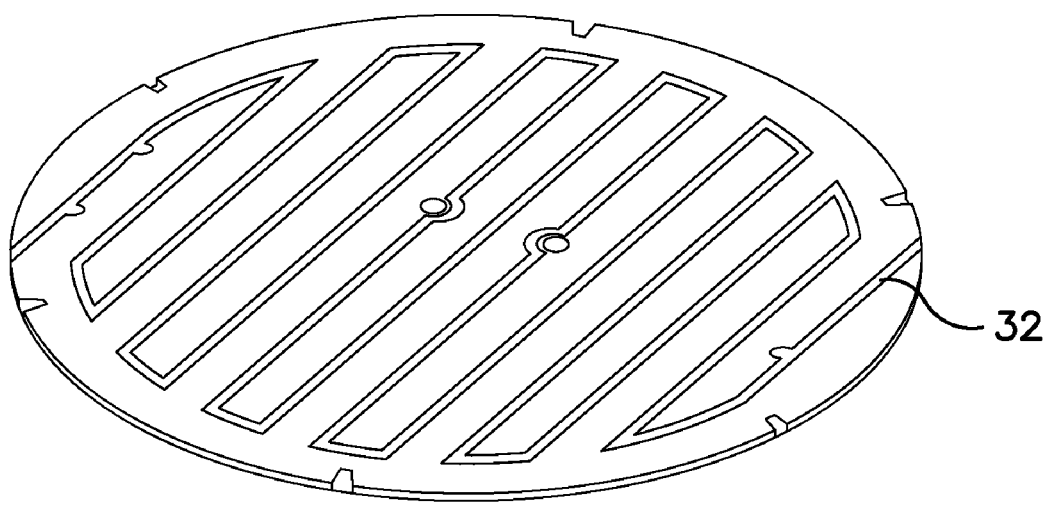
FIG. 6 is a plan view of one embodiment of a bipolar electrode arrangement that may be incorporated into the workpiece support of the present disclosure.

In one embodiment in order to form an electrostatic chuck, a bipolar electrode array 32 as shown in FIG. 6 can be positioned in between the first dielectric layer 28 and the second dielectric layer 30. The electrode array 32 can be placed in communication with a DC power supply 34 as shown in FIG. 2. Two different DC voltages can be supplied by a single DC power supply or by two independent power supplies. The DC power supply 34 supplies the voltages necessary to create an electric field for producing electrostatic attraction between the workpiece-receiving surface 18 and a workpiece held on the surface. The amount of voltage created by the DC power supply can be used to adjust the amount of electrostatic attraction. Further, when it is necessary to remove the workpiece from the workpiece support, the DC power supply can be turned off so that no voltage is being produced or can create a reverse polarity voltage from the starting potential. DC voltages typically vary from about 500 to 2000 volts.

As shown in FIG. 2, the workpiece support 12 can further be in communication with an RF conduit 36 that is in communication with an RF impedance matching device (not shown) in communication with an RF power supply 38 for supplying an RF bias power to the workpiece.

In an alternative embodiment, the RF source power can be coupled to the workpiece support 12 through an RF impedance matching device (not shown) that is in communication with a RF conduit 36. In this embodiment, there is no additional RF power supplied to the processing station 13.

In an alternative embodiment, no RF source power is coupled to the workpiece support 12.

During workpiece processing, the RF power source produces ions and electrons in the plasma for desired chemical reactions with the front surface of the workpiece. The RF bias power, on the other hand, provides independent control of the energy that ions have when they strike the top surface of the workpiece.

The RF power supplies and the DC power supply can both be grounded using any suitable technique. In one embodiment, for instance, both RF and DC power supplies may be grounded to an electrode in communication with the processing chamber.

In the embodiments illustrated, the process chamber employs inductive-coupled RF power to generate and maintain a plasma necessary for workpiece processing. The RF bias power is capacitively coupled to the plasma through the workpiece support 12 also acting as an electrostatic chuck.

In order to load and unload workpieces on the workpiece-receiving surface 18, the workpiece support 12 can include any suitable mounting device. For instance, in one embodiment, the workpiece support may include a plurality of lift pins that can be used to properly position a workpiece on the workpiece-receiving surface and to elevate and lower the workpiece on the workpiece-receiving surface. In this regard, the workpiece support 12 as shown in FIG. 2 can include a plurality of pin channels 41 for a lift pin assembly. In one embodiment, for instance, the workpiece support 12 may include 3 pin channels for accommodating 3 pins.

In accordance with the present disclosure, the workpiece support 12 further includes a plurality of fluid zones formed on the workpiece-receiving surface 18 that are intended to allow for temperature modifications to be made to a workpiece positioned on the workpiece support. The fluid zones are in communication with a fluid supply for feeding a fluid into the zones at a particular pressure. The fluid fed to the zones can be any fluid having suitable thermal conductivity characteristics. For instance, in one embodiment, the fluid may comprise a gas, such as helium or hydrogen.

In accordance with the present disclosure, at least certain of the fluid zones are located at different azimuthal positions on the workpiece-receiving surface. Collectively, the fluid zones are intended to allow for temperature control of the workpiece not only in a radial direction, but also in an azimuth direction.

Figure 3:
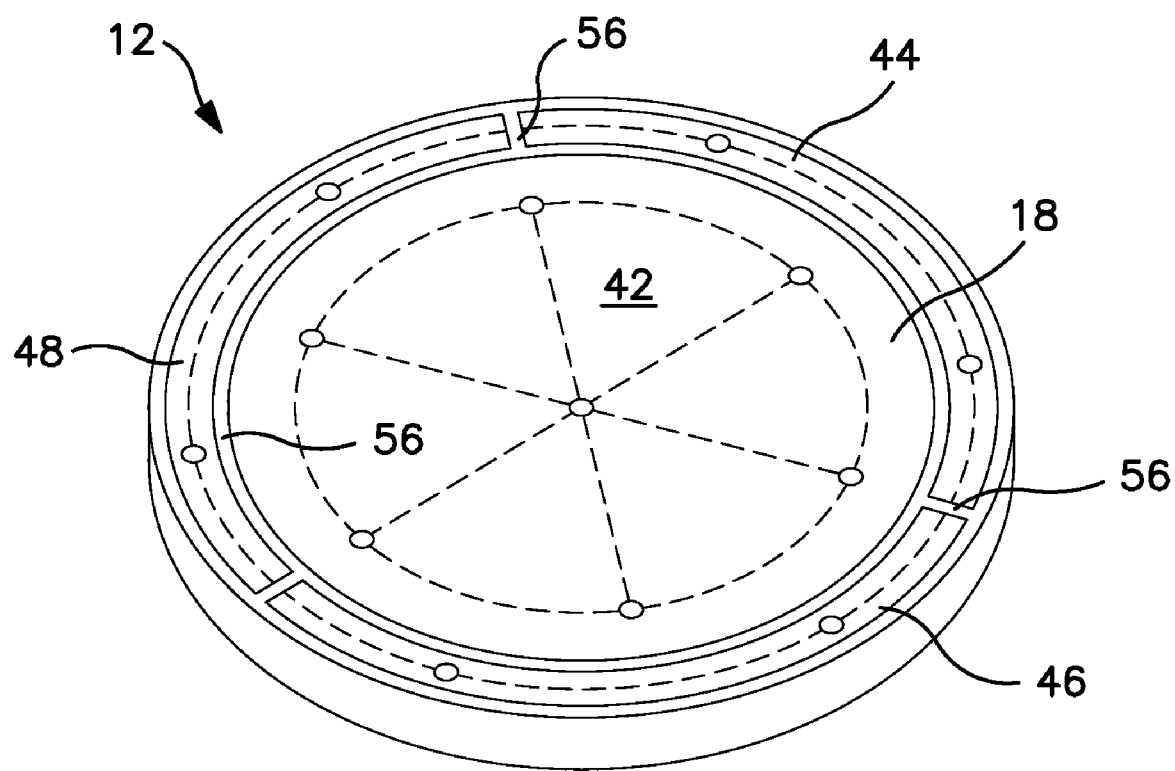
FIG. 3 is a perspective view of one embodiment of a workpiece-receiving surface for a workpiece support made in accordance with the present disclosure.
Figure 5A:
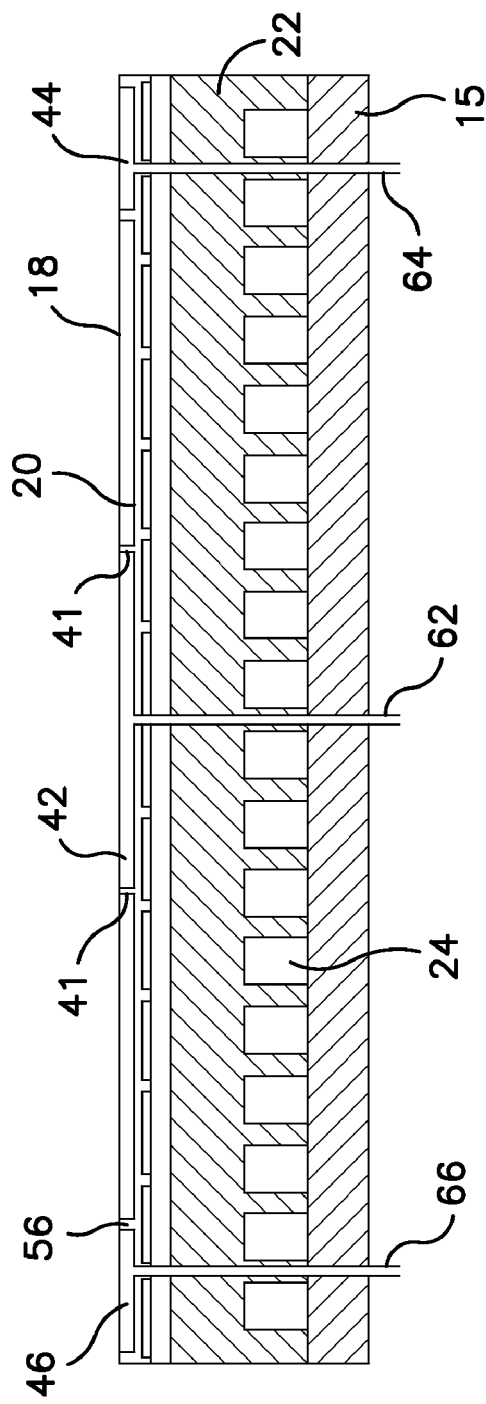
FIGS. 5($a$) and 5($b$) are cross-sectional views of the workpiece support illustrated in FIG. 2 showing in FIG. 5($b$) a wafer positioned on the workpiece-receiving surface.
Figure 5B:
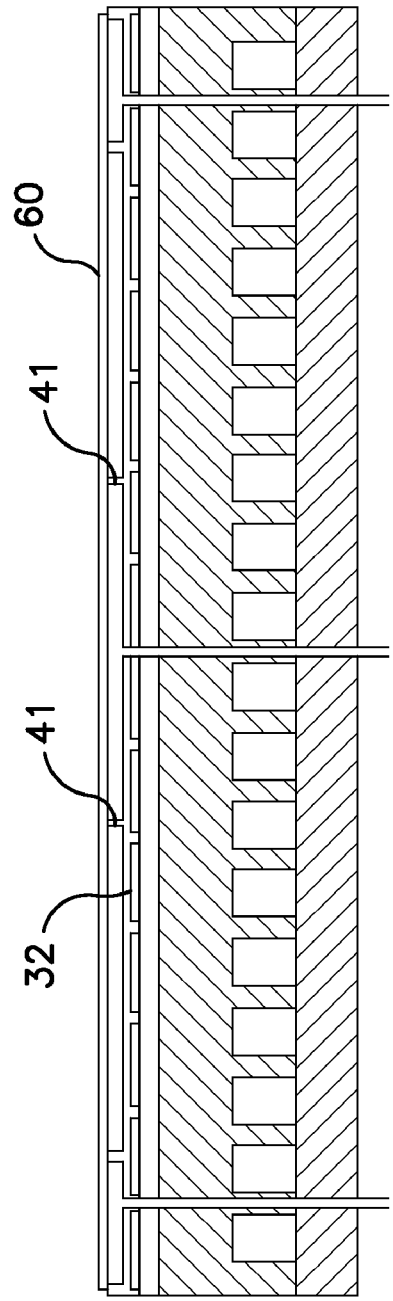

For instance, referring to FIGS. 3 and 5, one embodiment of a workpiece support made in accordance with the present disclosure is shown. Referring to FIG. 3, for instance, the workpiece-receiving surface 18 of the workpiece support 12 defines a central fluid zone 42 that is surrounded by, in this embodiment, 3 peripheral fluid zones 44, 46, and 48. The fluid zones are separated by ridges 56. The ridges 56 are intended to form a seal with the back surface of a workpiece positioned on the workpiece-receiving surface 18. The ridges 56 can be made from the same dielectric material used to form the workpiece-receiving surface or can be made from a different material. The top surface of ridges 56 forms the workpiece receiving surface 18.

Referring to FIGS. 5(*a*) and 5(*b*), a cross-sectional view of the workpiece support 12 illustrated in FIG. 3 is shown. In the embodiment illustrated in FIG. 5(*b*), a workpiece 60, such as a semiconductor wafer, is shown positioned on the workpiece-receiving surface 18, while in FIG. 5(*a*), the workpiece 60 is removed. As described above, the ridges 56 form a seal with the workpiece 60. Thus, discrete and independent fluid zones are formed. In the figures, central fluid zone 42 is shown in conjunction with peripheral zones 44 and 46.

In order to insure that the workpiece 60 retains a flat surface when in contact with the workpiece-receiving surface 18, the central fluid zone 42 may also contains a number of support pillars 41 that are distributed across the central zone to support the workpiece 60. These support pillars 41 have a height equal to the height of the ridges 56. The top of the support pillars 41 will typically have a small circular contact area that contacts the back surface of the workpiece 60. The top surface of support pillars 41 is an additional component of the workpiece-receiving surface 18.

In order to flow a fluid into the zones, the central fluid zone 42 is in communication with a fluid supply 62, which is also shown in the cross-section of FIG. 2. As also shown in FIGS. 5(*a*) and 5(*b*), fluid zone 44 is in communication with a fluid supply 64, while fluid zone 46 is in communication with a fluid supply 66. As will be described in greater detail below, the pressure in each zone may be controlled independently of the other zones.

During processing, a heat conductive fluid, such as helium gas, hydrogen gas and the like, are fed at selected pressures to each of the zones. The fluid zones thus become pressurized against the back surface of the workpiece 60. The heat conductive fluid can include a mixture of fluids as well as a single fluid. Increasing the pressure of the fluid increases the amount of thermal conduction that takes place between the fluid and the workpiece. When feeding a gas into the fluid zones, for instance, the gas pressure within the zones can vary from about 1 Torr to about 800 Torr.

As shown in FIG. 3, in the embodiment illustrated, the workpiece support includes a relatively large centrally located fluid zone surrounded by peripheral zones. In some applications, for instance, the spatial distribution of both power input and the cooling body are usually flat in the central part of the workpiece area. Thus, in some applications, only a single central fluid zone may be needed for adequate temperature control.

Greater cooling and temperature non-uniformities, however, can occur in the peripheral regions of the workpiece. The present inventors have discovered that the temperature irregularities may exist not only at certain radial positions, but may also exist at different azimuthal or angular positions. Thus, in accordance with the present disclosure, the workpiece support 12 includes a plurality of independent fluid zones located at different azimuthal positions. For example, in the embodiment illustrated in FIG. 3, the peripheral fluid zones are located over a peripheral band. The peripheral band is then subdivided into the peripheral fluid zones 44, 46, and 48. By varying fluid pressure in the peripheral fluid zones in relation to each other, azimuthal temperature non-uniformities caused by the non-uniform energy input and non-uniform temperature distributions can be accounted for and corrected.

In the embodiment illustrated in FIG. 3, the peripheral band is divided into 3 fluid zones having substantially the same shape and surface area. It should be understood, however, that the peripheral band can be divided into more or less fluid zones. For instance, the peripheral band as shown in FIG. 3 can be divided into from about 2 fluid zones to 12 fluid zones or even greater.

Further, the peripheral fluid zones do not necessarily have to have the same surface area and shape. Both size and shape of the peripheral fluid zones can vary and be tailored to a particular application. For instance, in one embodiment, all of the peripheral fluid zones can have different shapes and sizes. In still other embodiments, certain of the peripheral fluid zones can have the same size, while other peripheral fluid zones can have a different size.

Figure 8:
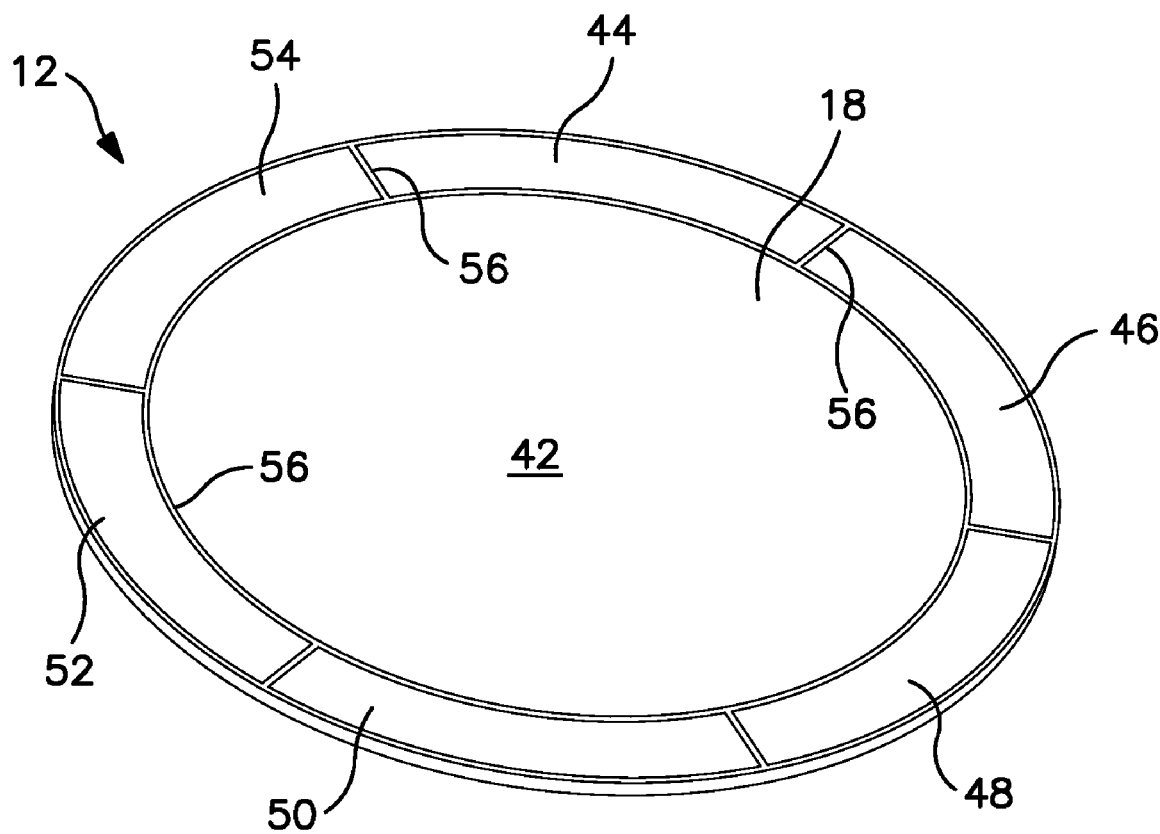
FIG. 8 is a perspective view of another embodiment of a workpiece support made in accordance with the present disclosure.

For example, referring to FIGS. 8-12, various other embodiments of a workpiece-receiving surface of a workpiece support are shown. Like reference numerals have been used to indicate similar elements. FIG. 8, for instance, illustrates a workpiece-receiving surface similar to the workpiece-receiving surface 18 shown in FIG. 3. In the embodiment illustrated in FIG. 8, instead of three peripheral fluid zones, the workpiece-receiving surface 18 includes six peripheral fluid zones 44, 46, 48, 50, 52 and 54. As shown, each of the fluid zones is separated by ridges 56.

Figure 9:
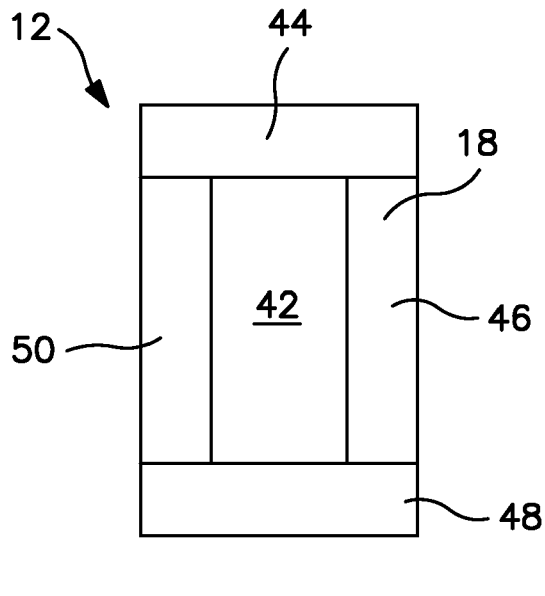
FIG. 9 is a plan view of another embodiment of a workpiece support made in accordance with the present disclosure.
Figure 10:
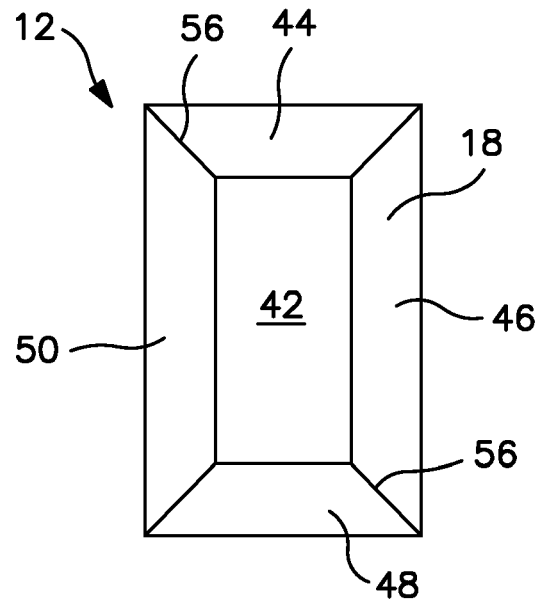
FIG. 10 is a plan view of another embodiment of a workpiece support made in accordance with the present disclosure.

FIGS. 9 and 10, on the other hand, illustrate workpiece-receiving surfaces 18 of a workpiece support 12 that have a rectangular shape. The workpiece-receiving surfaces 18 as shown in FIGS. 9 and 10, for instance, may be used to process rectangular-shaped workpieces or substrates. In both FIGS. 9 and 10, each workpiece-receiving surface 18 includes a central fluid zone 42 surrounded by peripheral fluid zones 44, 46, 48 and 50. In FIG. 9, the peripheral zones all have a rectangular shape and, all approximately have about the same surface area.

In FIG. 10, on the other hand, the peripheral fluid zones 44, 46, 48 and 50 have different sizes. In particular, peripheral zones 46 and 50 are larger than peripheral zones 44 and 48. The peripheral zones are separated from each other by diagonal ridges 56.

Figure 11:
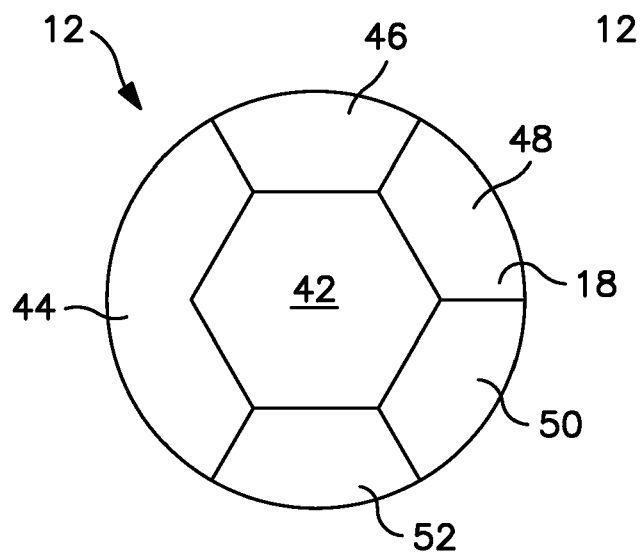
FIG. 11 is a plan view of another embodiment of a workpiece support made in accordance with the present disclosure.
Figure 12:
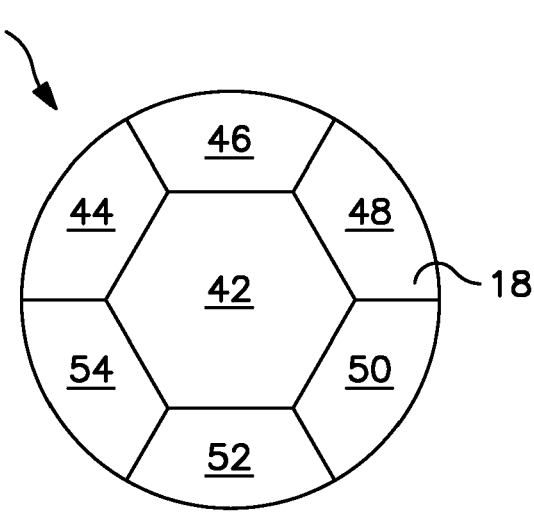
FIG. 12 is a plan view of another embodiment of a workpiece support made in accordance with the present disclosure.

Referring to FIGS. 11 and 12, still other embodiments of workpiece-receiving surfaces 18 of a workpiece support 12 are shown. In the embodiments illustrated in FIGS. 11 and 12, the central fluid zone 42 has a polygon-like shape. In particular, the central fluid zones 42 are in the shape of a hexagon.

In FIG. 12, the central fluid zone 42 is surrounded by peripheral zones 44, 46, 48, 50, 52 and 54. All of the peripheral fluid zones generally have the same shape and surface area.

In FIG. 11, on the other hand, the central fluid zone is surrounded by peripheral fluid zones in which one of the peripheral fluid zones has a size larger than the other zones. As shown, the central fluid zone 44 is surrounded by the peripheral fluid zones 44, 46, 48, 50 and 52. The peripheral fluid zone 44 is generally double the size of the other fluid zones.

The manner in which a fluid is fed to each of the fluid zones can depend upon the number of fluid zones and the particular fluid being fed to the zones. For exemplary purposes only, referring to FIG. 4, one embodiment of a fluid supply system is illustrated. As shown, the system includes a fluid inlet 70 that can be placed in communication with a fluid reservoir (not shown). For instance, when feeding a gas to the fluid zones, the fluid inlet can be placed in communication with a pressurized gas source.

As shown, the fluid inlet 70 is in communication with a valve device 72, such as a pneumatic valve. From the valve 72, the fluid inlet 70 separates into a first fluid line 74 and a second fluid line 76. The first fluid line 74 includes a flow meter 78 and a control valve 79, and a pressure sensor 80. From the pressure sensor 80, the fluid line feeds into the fluid supply 62 for supplying fluid to the centralized fluid zone 42 as shown in FIG. 3.

Similarly, the second fluid line 76 also includes a flow meter 82, a control valve 83, and a pressure sensor 84. From the pressure sensor 84, the fluid line feeds into a fluid supply 64 for supplying fluid to, for instance, one of the peripheral zones. As can be appreciated, the fluid supply system can include further fluid lines depending upon the number of different fluid zones contained on the workpiece-receiving surface of the workpiece support.

Figure 4:
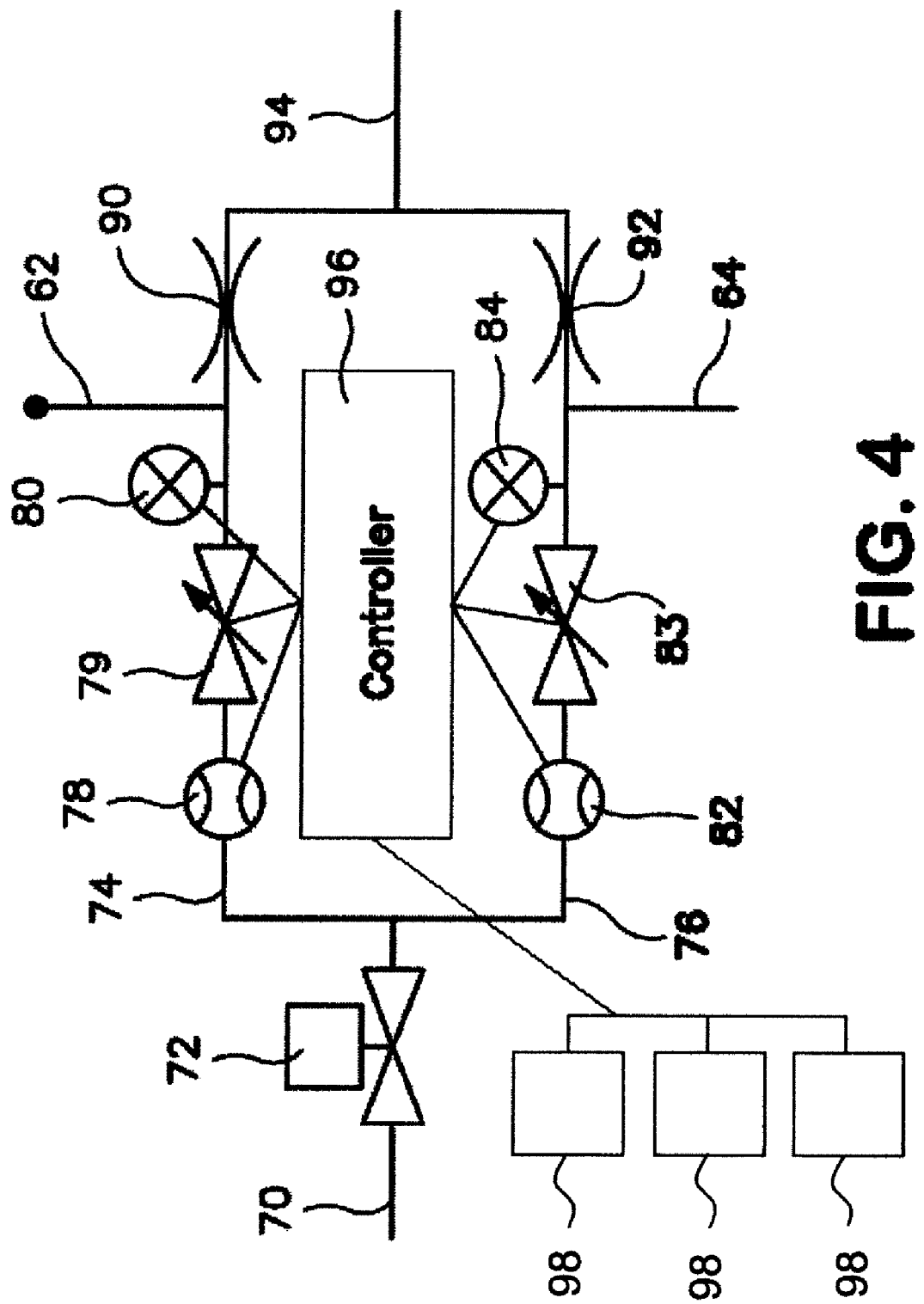
FIG. 4 is a diagram of one embodiment of a fluid supply system that may be used in accordance with the present disclosure.

As shown in FIG. 4, the fluid supply can further include a controller 96. As use herein, a "controller" is intended to cover systems with a single controller or systems that contain multiple controllers for each of the components. The controller 96, for instance, may comprise one or more electronic devices, such as one or more microprocessors, or one or more programmable logic units. The controller 96 can be placed in communication with the flow meters 78 and 82, the control valves 79 and 83, and the pressure sensors 80 and 84.

During processing, in one embodiment, the controller 96 can be preprogrammed with a given pressure set point or can be configured to calculate a pressure set point based upon various parameters. The controller 96 can then be used to control the variable orifice control valves 79 and 83 so that gas pressure substantially equals the pressure set point as may be indicated by the pressure sensors 80 and 84.

As shown in FIG. 4, the fluid supply system, in one embodiment, can include fixed orifices 90 and 92 which are in communication with fluid lines 74 and 76 respectively. The fixed orifices 90 and 92 are also in downstream communication with a fluid line 94. In some embodiments, especially when the fluid zones form a fluid tight seal with the workpiece within the process chamber, it may be desirable that a small amount of fluid flow through the valves 83 and 79 in order to meet the pressure set point set by the controller 96. Thus, in order to facilitate pressure control, in one embodiment, the fluid supply system can include the fixed orifices 90 and 92.

In the embodiment illustrated in FIG. 4, the fluid supply system includes independent control circuits for two separate areas. In particular, the flow meter 78, the control valve 79, and the pressure sensor 80 can be used to control gas pressure within the central fluid zone 42. The control valve 83, the flow meter 82, and the pressure sensor 84, on the other hand, can be used to control pressure within one of the peripheral zones of the workpiece-receiving surface. In one embodiment, every fluid zone on the workpiece-receiving surface 18 may be in communication with a separate and distinct flow meter, control valve and pressure sensor for individual control in each of the fluid zones. The amount of controls needed for each of the fluid zones can depend upon various factors and the particular application.

The manner in which the fluid enters the fluid zones from the fluid supply system and is redistributed within the zones may depend on the position and specifics of other elements of the electrostatic chuck and is not important for the current invention.

In one embodiment, the workpiece processing system as shown in FIG. 1 can include one or more temperature measuring devices 98 that are configured to sense and monitor the temperature of a workpiece within the processing chamber. In general, any suitable temperature-measuring device may be used. For example, measuring devices that may be used include pyrometers, thermocouples, thermistors, fiber optic temperature sensors, and the like.

In one embodiment, the wafer processing system can include a plurality of temperature measuring devices 98 that are configured to measure the temperature of the workpiece in multiple locations. In this embodiment, for instance, pyrometers may be used that measure the temperature of the workpiece without contacting the workpiece. A pyrometer, for instance, may measure the temperature of the workpiece at each of the locations where the fluid zones are located.

The temperature measuring devices 98 may be placed in communication with the controller 96 as shown in FIG. 4. The controller 96 may be configured to control the pressure in each of the fluid zones based upon information received from the temperature measuring devices 98. In this manner, the temperature of the workpiece can be adjusted at the azimuthal locations based upon the temperature sensed by the temperature measuring devices 98.

The controller 96, for instance, may work in an open loop fashion, in a closed loop fashion or in a model-based fashion. For instance, in an open loop system, a representative workpiece may first be processed in the processing chamber. During processing, the temperature of the workpiece may be monitored at multiple locations. Based upon the information received from the temperature measuring devices, the controller can be programmed to control pressure to each of the fluid zones for processing similar workpieces.

Alternatively, the controller can be configured to control pressure to the fluid zones during the processing of each workpiece based upon real time temperature measurements in a closed loop arrangement.

The fluid zones may be used to control the temperature of the workpiece for different reasons. For instance, in one embodiment, the fluid zones can be used to more uniformly heat the workpiece within the processing chamber. In other embodiments, however, it may be desirable to heat the workpiece in a non-uniform fashion. For example, in some processes, it may be desirable to have a particular temperature profile over the surface of the workpiece rather than a uniform one.

In the embodiment illustrated in FIG. 1, as described above, the workpiece processing system includes a plasma source for carrying out different processes. As shown, for instance, the process chamber includes an opening 11 for introducing reactants into the chamber. Any suitable reactant delivery system may be incorporated into the chamber. For instance, in one embodiment, a showerhead may be positioned within the opening 11.

In addition to a reactant delivery system, the process chamber may also be in communication with a pumping device for pumping fluids, such as gases, out of the chamber when desired. In addition, the pumping device can create vacuum or near vacuum conditions within the chamber. For instance, the process chamber is particularly well suited for carrying out processes at pressures less than about 500 Torr, such as less than about 5 Torr, such as even less than about 0.005 Torr.

It should be understood, however, that the workpiece support of the present disclosure may be used in other various and different types of process chambers. For instance, the teachings of the present disclosure are equally applicable to process chambers for carrying out chemical vapor deposition, etching, annealing, and the like.

These and other modifications and variations to the present invention may be practiced by those of ordinary skill in the art, without departing from the spirit and scope of the present invention, which is more particularly set forth in the appended claims. In addition, it should be understood that aspects of the various embodiments may be interchanged both in whole or in part. Furthermore, those of ordinary skill in the art will appreciate that the foregoing description is by way of example only, and is not intended to limit the invention so further described in such appended claims.

What is claimed is:

1. A workpiece support for holding a workpiece in a process chamber:
   a workpiece support defining a workpiece-receiving surface for receiving and holding a workpiece;
   a plurality of partitioned fluid zones on the workpiece-receiving surface, each fluid zone being in communication with a separate fluid line, wherein, when fluids are fed to each of the fluid zones, each fluid zone becomes pressurized, the fluid zones being separated by ridges on the workpiece-receiving surface, the top surface of the ridges contacting the bottom surface of the workpiece when the workpiece is placed on the workpiece-receiving surface such that the workpiece, the workpiece-receiving surface, and the ridges define an enclosed volume for each partitioned fluid zone, and wherein at least certain of the zones have a different azimuthal position on the workpiece-receiving surface, and further wherein the fluid line for each fluid zone comprises a control valve configured to independently control pressure in each respective fluid zone to adjust the temperature across a workpiece received onto the workpiece support;
   wherein the workpiece-receiving surface has a perimeter and includes an outer periphery adjacent to the perimeter, the outer periphery comprising a peripheral band that is divided into the fluid zones having different azimuthal positions;
   and wherein the workpiece support further includes a fluid zone centrally located on the workpiece-receiving surface.

2. A workpiece support as defined in claim 1, wherein at least 2 partitioned fluid zones are located on the peripheral band.

3. A workpiece support as defined in claim 1, wherein the peripheral band is divided into from about 3 zones to about 12 zones.

4. A workpiece support as defined in claim 1, wherein the workpiece support comprises an electrostatic chuck.

5. A workpiece support as defined in claim 4, wherein the workpiece support includes a metallic or ceramic base coated with a dielectric material, and wherein the workpiece support further includes one or more electrodes positioned within the dielectric material and a DC power supply for applying a different voltage to each embedded electrode.

6. A workpiece support as defined in claim 1, wherein the fluid zones having different azimuthal positions all have a substantially identical shape and surface area.

7. A workpiece support as defined in claim 1, wherein the peripheral band is equally divided into fluid zones.

8. A process chamber containing the workpiece support defined in claim 1.

9. A process chamber as defined in claim 8, wherein the chamber has a processing region that is in communication with an energy source or a reactant source.

10. A process chamber as defined in claim 8, further comprising at least one temperature measuring device for measuring the temperature of a workpiece positioned on the workpiece support, the processing chamber further comprising a controller in communication with the temperature measuring device and the fluid lines, the controller being configured to independently control the amount of fluid being fed to each fluid zone based upon information received from the temperature measuring device.

11. A process chamber of claim 10, wherein the controller is coupled to the control valve of each respective fluid line, the controller configured to independently control the amount of fluid being fed to each fluid zone by controlling the control valve of each respective fluid line.

12. A workpiece support as defined in claim 1, wherein the ridges form a seal with a workpiece positioned on the workpiece support.

13. A workpiece support of claim 1, wherein each fluid line further comprises a flow meter and a pressure sensor.

14. A workpiece support of claim 1, wherein the control valve of each respective fluid line is in communication with a controller, the controller configured to independently control the control valve of each respective fluid line to independently control the pressure of each respective fluid zone.

15. A workpiece processing system comprising:
a processing chamber for processing workpieces;
an energy source in communication with the processing chamber;
a workpiece support contained within the processing chamber, the workpiece support defining a workpiece-receiving surface for receiving and holding a workpiece;
a plurality of partitioned fluid zones on the workpiece-receiving surface, each fluid zone being in communication with a fluid line, the fluid zones being separated by ridges on the workpiece-receiving surface, the top surface of the ridges contacting the bottom surface of the workpiece when the workpiece is placed on the workpiece-receiving surface such that the workpiece, the workpiece-receiving surface, and the ridges define an enclosed volume for each partitioned fluid zone_and wherein at least certain of the zones have a different azimuthal position on the workpiece-receiving surface;
a controller in communication with the fluid lines, the controller being configured to independently control the pressure in the fluid zones to adjust the temperature across a workpiece received onto the workpiece-receiving surface;
wherein the workpiece-receiving surface has a perimeter and includes an outer periphery adjacent to the perimeter, the outer periphery comprising a peripheral band that is divided into the fluid zones having different azimuthal positions;
and wherein the workpiece support further includes a fluid zone centrally located on the workpiece-receiving surface.

16. A workpiece processing system as defined in claim 15, further comprising a plurality of temperature measuring devices for determining the temperature of a workpiece contained within the processing chamber, the system including a corresponding temperature-measuring device for each of the fluid zones.

17. A workpiece processing system as defined in claim 16, wherein the temperature measuring devices comprise pyrometers, thermocouples, thermistors, fiber optic temperature sensors, or mixtures thereof, each of the temperature measuring devices being in communication with the controller, the controller being configured to control the pressure in the fluid zones based upon information received from the temperature measuring devices.

18. A workpiece processing system as defined in claim 15, wherein the workpiece support comprises an electrostatic chuck and wherein the energy source in communication with the processing region comprises a plasma source, a thermal energy source, an ion source, a reactive chemical source, or a combination thereof.

19. The workpiece processing system of claim 15, wherein each fluid line further comprises a control valve, the controller configured to independently control each control valve to independently control pressure in each respective fluid zone.

20. A workpiece processing system of claim 19, wherein each fluid line further comprises a flow meter and a pressure sensor.

* * * * *